(12) United States Patent
Arvelo et al.

(10) Patent No.: US 10,422,451 B2
(45) Date of Patent: Sep. 24, 2019

(54) TAPERING COUPLERS FOR CONNECTING FLUID FLOW COMPONENTS

(71) Applicant: INTERNATIONAL BUSINESS MACHINES CORPORATION, Armonk, NY (US)

(72) Inventors: Amilcar R. Arvelo, Poughkeepsie, NY (US); Michael J. Ellsworth, Jr., Poughkeepsie, NY (US); Eric J. McKeever, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 984 days.

(21) Appl. No.: 14/482,147

(22) Filed: Sep. 10, 2014

(65) Prior Publication Data

US 2016/0363243 A1    Dec. 15, 2016

(51) Int. Cl.
*F16L 21/00*    (2006.01)
*F16L 25/14*    (2006.01)
(Continued)

(52) U.S. Cl.
CPC ............. *F16L 21/002* (2013.01); *F15D 1/00* (2013.01); *F16L 25/14* (2013.01);
(Continued)

(58) Field of Classification Search
CPC ............ F16D 1/00; F16L 25/14; F16L 21/002
(Continued)

(56) References Cited

U.S. PATENT DOCUMENTS

| 817,058 A | * | 4/1906 | Greenfield |
| 1,722,676 A | * | 7/1929 | Parker ................... F16L 47/265 |
| | | | 285/148.23 |

(Continued)

FOREIGN PATENT DOCUMENTS

| DE | 004230832 A1 | 3/1994 |
| DE | 102005040807 A1 | 3/2007 |
| EP | 000769586 A2 | 4/1997 |

OTHER PUBLICATIONS

Lee et al., "Numerical Study of the Flow inside the A250 Diffuser Tube," In 20th Annual Conference of the CFD Society of Canada, Canmore, AB. (2012) (8 pages).

(Continued)

*Primary Examiner* — Aaron M Dunwoody
(74) *Attorney, Agent, or Firm* — Tihon Poltavets, Esq.; Kevin P. Radigan, Esq.; Heslin Rothenberg Farley & Mesiti P.C.

(57) ABSTRACT

Tapering couplers and coupling methods for connecting fluid flow components are provided. In one embodiment, the tapering coupler includes a housing with a first opening and a second opening in fluid communication through the housing. The first opening is sized for a first fluid flow component to couple to the housing, and the second opening for a second fluid flow component. The first and second fluid flow components include first and second fluid-carrying channels of different diameter, with the first fluid-carrying channel having a first channel diameter that is larger than the second channel diameter of the second fluid-carrying channel. A tapering element is associated with the housing and extends into the first fluid-carrying channel. The tapering element includes a tapering fluid-carrying channel which tapers in a (Continued)

direction back towards the housing, for instance, from about the first channel diameter to about the second channel diameter.

7 Claims, 10 Drawing Sheets

(51) Int. Cl.
*F15D 1/00* (2006.01)
*H05K 7/20* (2006.01)
*F16L 55/027* (2006.01)

(52) U.S. Cl.
CPC ..... *H05K 7/20272* (2013.01); *H05K 7/20772* (2013.01); *F16L 55/027* (2013.01)

(58) Field of Classification Search
USPC ............ 285/332, 148.23, 148.22; 138/40, 44
See application file for complete search history.

(56) References Cited

U.S. PATENT DOCUMENTS

| | | | | |
|---|---|---|---|---|
| 2,017,362 | A * | 10/1935 | Werder | F16L 19/0206 285/148.16 |
| 3,390,897 | A * | 7/1968 | Moore | F16L 15/006 285/33 |
| 3,768,841 | A * | 10/1973 | Byrne | B29C 66/636 285/21.1 |
| 3,893,451 | A * | 7/1975 | Durand | A61B 5/0215 600/486 |
| 4,013,309 | A * | 3/1977 | Quick | F16L 47/20 285/133.21 |
| 4,553,587 | A * | 11/1985 | Traylor | F01P 11/06 165/95 |
| 5,064,225 | A * | 11/1991 | Williams | B25B 27/10 285/148.26 |
| 5,143,408 | A * | 9/1992 | Holtsmark | F16L 25/14 285/148.23 |
| 5,611,576 | A * | 3/1997 | Guala | A61M 39/10 285/332 |
| 6,045,162 | A * | 4/2000 | Haibara | F02M 55/005 285/133.4 |
| 6,119,728 | A * | 9/2000 | Seidel-Peschmann | F16L 55/0331 138/26 |
| 7,942,139 | B1 * | 5/2011 | Rockwell | F02M 35/10118 123/188.7 |
| 2003/0051844 | A1 | 3/2003 | Aidun | |
| 2007/0145738 | A1 * | 6/2007 | Akiba | A61B 1/12 285/179 |
| 2007/0145739 | A1 * | 6/2007 | Haberl | F16L 3/16 285/253 |
| 2010/0037629 | A1 * | 2/2010 | Voorhis | F25B 41/06 62/56 |
| 2010/0117356 | A1 * | 5/2010 | Pucciani | F16L 21/002 285/238 |
| 2010/0243258 | A1 | 9/2010 | Fishbeck et al. | |
| 2011/0061757 | A1 | 3/2011 | Butler | |
| 2012/0169045 | A1 * | 7/2012 | Berghaus | B21D 39/04 285/332 |
| 2013/0134143 | A1 | 5/2013 | Hassan et al. | |
| 2013/0257036 | A1 * | 10/2013 | Guest | F16L 37/0925 285/93 |

OTHER PUBLICATIONS

Field et al., "A versatile sensor performance evaluation platform with an impactor-inspired sample chamber and virtual pin grid array," Measurement Science and Technology, vol. 25, No. 6 (2014): 065901 (12 pages).

Arvelo, Amilcar R., "Tapering Couplers for Connecting Fluid Flow Components", U.S. Appl. No. 14/824,559, filed Aug. 12, 2015 (37 pages).

Arvelo, Amilcar R., "Listing of IBM Patents and/or Patent Applications Treated as Related", U.S. Appl. No. 14/482,147, filed Sep. 10, 2014, dated Mar. 9, 2016 (2 pages).

* cited by examiner

TAPERING COUPLERS FOR CONNECTING FLUID FLOW COMPONENTS

STATEMENT REGARDING FEDERALLY SPONSORED RESEARCH OR DEVELOPMENT

This invention was made with Government support under Contract No. H98230-13-D-0122 awarded by the United States Department of Defense. Accordingly, the U.S. Government has certain rights to this invention.

BACKGROUND

Connectors for hollow, fluid-carrying conduits or tubes have been realized in a great variety of types and shapes. These connectors include threaded fittings, push-fit connectors, flange and/or hinge-based fittings, as well as barb fittings.

In certain applications, connectors are desired for coupling conduits to other structures, such as other conduits, or to a fitting, manifold, etc. In one embodiment, it may be desirable to connect a conduit to a manifold of, for instance, a liquid-cooled assembly configured to facilitate providing cooling to at least one electronic component of an electronics rack, that is, to facilitate removal of heat generated by the electronic component(s).

Additionally, in certain applications, connectors are desired for coupling differently-sized fluid flow components. Conventional techniques for configuring connectors to couple and transition between fluid flow components with different internal flow diameters typically require additional space in order to facilitate the transition. This can be a disadvantage where space is limited, such as is the case of a fluid-cooled assembly for an electronics rack.

BRIEF SUMMARY

In one aspect, provided herein is an apparatus which includes a tapering coupler. The tapering coupler includes a housing, and a tapering element associated with the housing. The housing has a first opening and a second opening in fluid communication through the housing, with the first opening being sized for a first fluid flow component to couple to the housing, and the second opening being sized for a second fluid flow component to couple to the housing, the first fluid flow component and the second fluid flow component comprising a first fluid-carrying channel and a second fluid-carrying channel, respectively, with the first fluid-carrying channel having a first channel diameter and the second fluid-carrying channel having a second channel diameter, where the first channel diameter is larger than the second channel diameter. The tapering element associated with the housing is sized to extend into the first fluid-carrying channel of the first fluid flow component when the first fluid flow component is coupled to the housing, with the first fluid-carrying channel of the first fluid flow component and the first opening of the housing in fluid communication. The tapering element includes a tapering fluid-carrying channel which tapers in a direction back towards the housing from about the first channel diameter to about the second channel diameter.

In another aspect, a fluid-carrying assembly is provided which includes a fluid conduit, a fluid flow component to be connected to the fluid conduit, and a tapering coupler. The tapering coupler includes a housing, and a tapering element associated with the housing. The housing has a first opening and a second opening in fluid communication through the housing. The first opening is sized for the fluid conduit to couple to the housing, and the second opening is sized for the fluid flow component to couple to the housing, where the fluid conduit and the fluid flow component include a first fluid-carrying channel and a second fluid-carrying channel, respectively. The first fluid-carrying channel has a first channel diameter, and the second fluid-carrying channel has a second channel diameter, wherein the first channel diameter is larger than the second channel diameter. The tapering element extends into the first fluid-carrying channel of the fluid conduit when the fluid conduit is coupled to the housing, with the first fluid-carrying channel of the fluid conduit and the first opening of the housing in fluid communication. The tapering element includes a tapering fluid-carrying channel which tapers in a direction back towards the housing from about the first channel diameter to about the second channel diameter.

In a further aspect, a method is provided which includes: providing a tapering coupler configured to couple a first fluid flow component and a second fluid flow component. The tapering coupler includes: a housing with a first opening and a second opening in fluid communication through the housing, the first opening being sized for the first fluid flow component to couple to the housing, and the second fluid opening being sized for the second fluid flow component to couple to the housing, the first fluid flow component and the second fluid flow component comprising a first fluid-carrying channel and a second fluid-carrying channel, respectively, the first fluid-carrying channel having a first channel diameter and the second fluid-carrying channel having a second channel diameter, wherein the first channel diameter is larger than the second channel diameter; and a tapering element associated with the housing and configured to extend into the first fluid-carrying channel of the first fluid flow component when the first fluid flow component is coupled to the housing, with the first fluid-carrying channel of the first fluid flow component and the first opening of the housing in fluid communication, the tapering element comprising a tapering fluid-carrying channel which tapers in a direction back towards the housing, from about the first channel diameter to about the second channel diameter.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
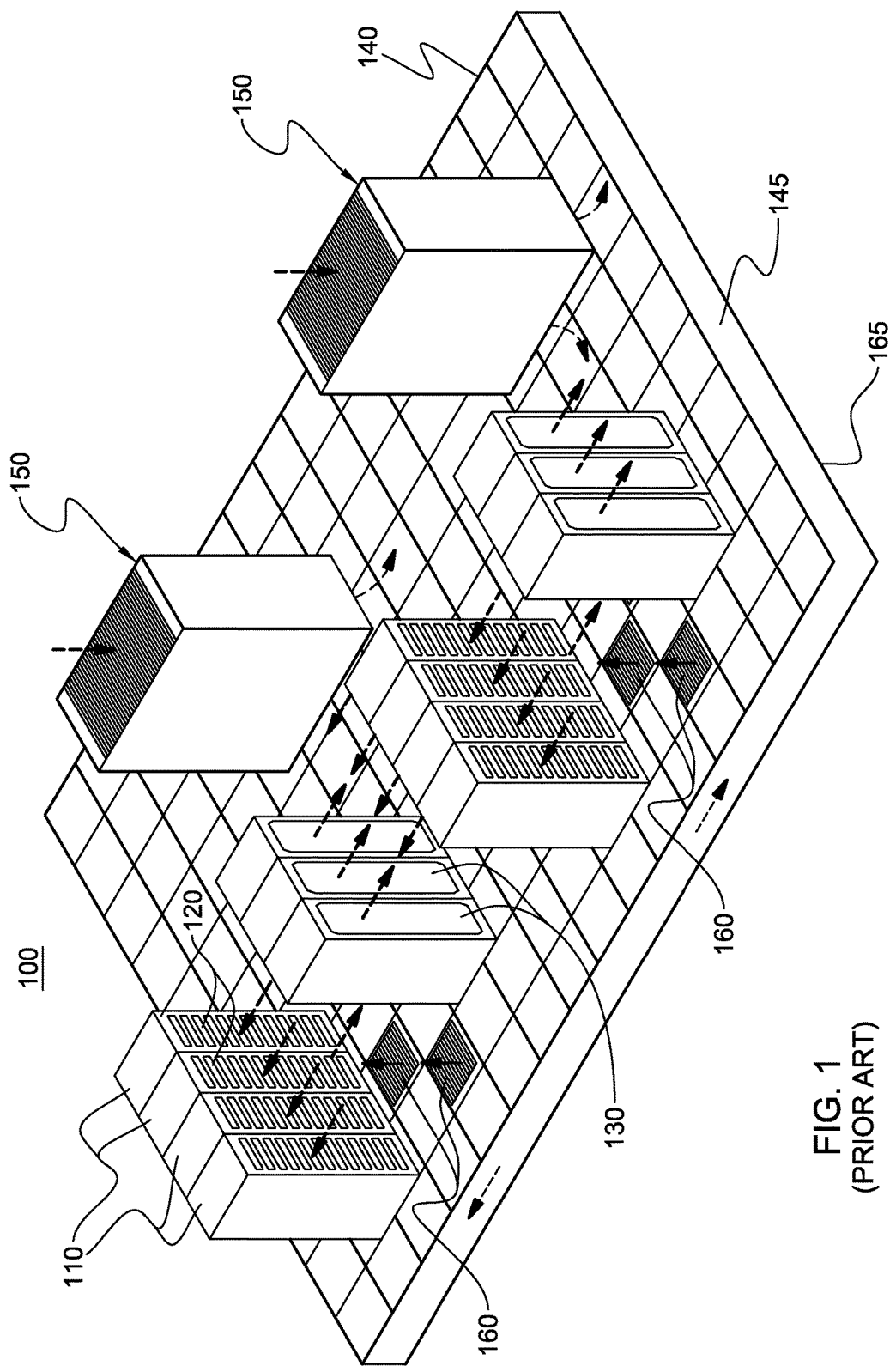
FIG. 1 depicts one embodiment of a conventional raised floor layout of an air-cooled data center.

Disclosed hereinbelow are various tapering couplers for coupling fluid flow components with different internal fluid flow diameters. For instance, the tapering couplers may facilitate coupling of a fluid conduit (or tube) to a connector fitting for a liquid manifold or liquid-manifold assembly. The tapering couplers disclosed may be provided for a variety of fluid assemblies. By way of example only, various cooling assemblies with fluid manifolds are described hereinbelow with reference to FIGS. 2-6, where the fluid manifold may be integrated as part of a coolant-cooled electronic module node, or rack, or be detachably coupled to a coolant-cooled electronic module, node or rack, to facilitate flow of coolant through the assembly to remove heat generated within the module, node or rack. Those skilled in the art will understand, however, that the tapering couplers disclosed may be used with various types of liquid flow assemblies, for instance, where any two fluid flow components with different internal liquid flow diameters are to be joined. Advantageously, the tapering couplers described hereinbelow with reference to FIGS. 7A-10C reduce or even minimize pressure drop between fluid flow components of a fluid-carrying assembly having different cross-sectional flow diameters, eliminating recirculation effects resulting from the coupling. Additionally, the tapering couplers presented minimize space required by providing transition between the fluid flow components (at least in part) within the fluid flow component with the larger internal flow diameter, and provide transition between different-diameter flow components without limiting conduit diameter for transitioning from a larger to smaller conduit. Note that, as used herein, "tapering coupler" refers to any coupling, adapter connector, etc., configured to join two or more fluid flow components, and which includes a tapering fluid-carrying channel.

Further, as used herein, the terms "electronics rack", and "rack-mounted electronic equipment" are used interchangeably, and unless otherwise specified include any housing, frame, rack, compartment, blade server system, etc., having one or more heat-generating components of a computer system or electronics system, and may be, for example, a stand-alone computer processor having high, mid or low end processing capability. In one embodiment, an electronics rack may comprise one or more electronic subsystems. "Electronic subsystem" refers to any sub-housing, blade, book, drawer, node, compartment, etc., of (for example) an electronics rack having one or more heat-generating electronic components disposed therein or thereon. An electronic subsystem of an electronics rack may be movable or fixed relative to the electronics rack, with the rack-mounted electronics drawers of a multi-drawer rack unit and blades of a blade center system being two examples of subsystems of an electronics rack to be cooled. In one specific example, "electronic subsystem" refers to an electronic system which comprises multiple different types of electronic components, and may be, in one example, a server node of a multi-server rack.

"Electronic component" refers to any heat-generating electronic component of, for example, a computer system or other electronics unit requiring cooling. By way of example, an electronic component may comprise one or more integrated circuit dies and/or other electronic devices to be cooled, including one or more processor dies, memory dies and memory support dies. As a further example, an electronic component may comprise one or more bare dies or one or more packaged dies disposed on a common carrier. As used herein, "primary heat-generating component" refers to a primary heat-generating electronic component within an electronic subsystem, while "secondary heat-generating component" refers to an electronic component of the electronic subsystem generating less heat than the primary heat-generating component to be cooled. Further, unless otherwise specified herein, the terms "coolant-cooled structure" or "coolant-cooled cold plate" refer to a thermally conductive structure having one or more channels or passageways formed therein or thereon for flowing of coolant therethrough. In addition, "metallurgically bonded" refers generally herein to two components being welded, brazed or soldered together by any means.

As used herein, a "liquid-to-liquid heat exchanger" may comprise, for example, two or more coolant flow paths, formed of thermally conductive tubing (such as copper or other tubing) in thermal or mechanical contact with each other. Size, configuration and construction of the liquid-to-liquid heat exchanger can vary without departing from the scope of the invention disclosed herein. Further, "data center" refers to a computer installation containing one or more electronics racks to be cooled. As a specific example, a data center may include one or more rows of rack-mounted computing units, such as server units.

One example of a coolant (for example, the facility or system coolants discussed below) is water. However, the concepts disclosed herein are readily adapted to use with other types of coolant. For example, one or more of the coolants may comprise a glycol mixture, a brine, a fluorocarbon liquid, a liquid metal, or other similar coolant, or refrigerant, while still maintaining the advantages and unique features of the present invention.

Reference is made below to the drawings, which are not drawn to scale to facilitate understanding of the invention, wherein the same reference numbers used throughout different figures designate the same or similar components.

FIG. 1 depicts a raised floor layout of an air cooled data center 100 typical in the prior art, wherein multiple electronics racks 110 are disposed in one or more rows. A data center such as depicted in FIG. 1 may house several hundred, or even several thousand microprocessors. In the arrangement illustrated, cool air enters the data center via perforated floor tiles 160 from a cool air plenum 145 defined between the raised floor 140 and a base or sub-floor 165 of the room. Cool air is taken in through louvered covers at air inlet sides 120 of the electronics racks and expelled through the back (i.e., air outlet sides 130) of the electronics racks. Each electronics rack 110 may have one or more air moving devices (e.g., fans or blowers) to provide forced inlet-to-outlet airflow to cool the electronic devices within the subsystem(s) of the rack. The supply air plenum 145 provides conditioned and cooled air to the air-inlet sides of the electronics racks via perforated floor tiles 160 disposed in a "cold" aisle of the data center. The conditioned and cooled air is supplied to plenum 145 by one or more air-conditioning units 150, also disposed within the data center 100. Room air may be taken into one or more air-conditioning units 150 near the upper portions thereof. This room air may comprise, in part, exhausted air from the "hot" aisles of the computer installation defined, for example, by opposing air outlet sides 130 of electronics racks 110.

Due to the ever-increasing airflow requirements through electronics racks, and the limits of air distribution within the typical data center installation, coolant-assisted cooling is being combined with the conventional air-cooling. FIGS. 2-6 illustrate one embodiment of a data center implementation employing a coolant-assisted cooling system with one or more cold plates coupled to high heat-generating electronic components disposed within the electronics racks.

Figure 2:
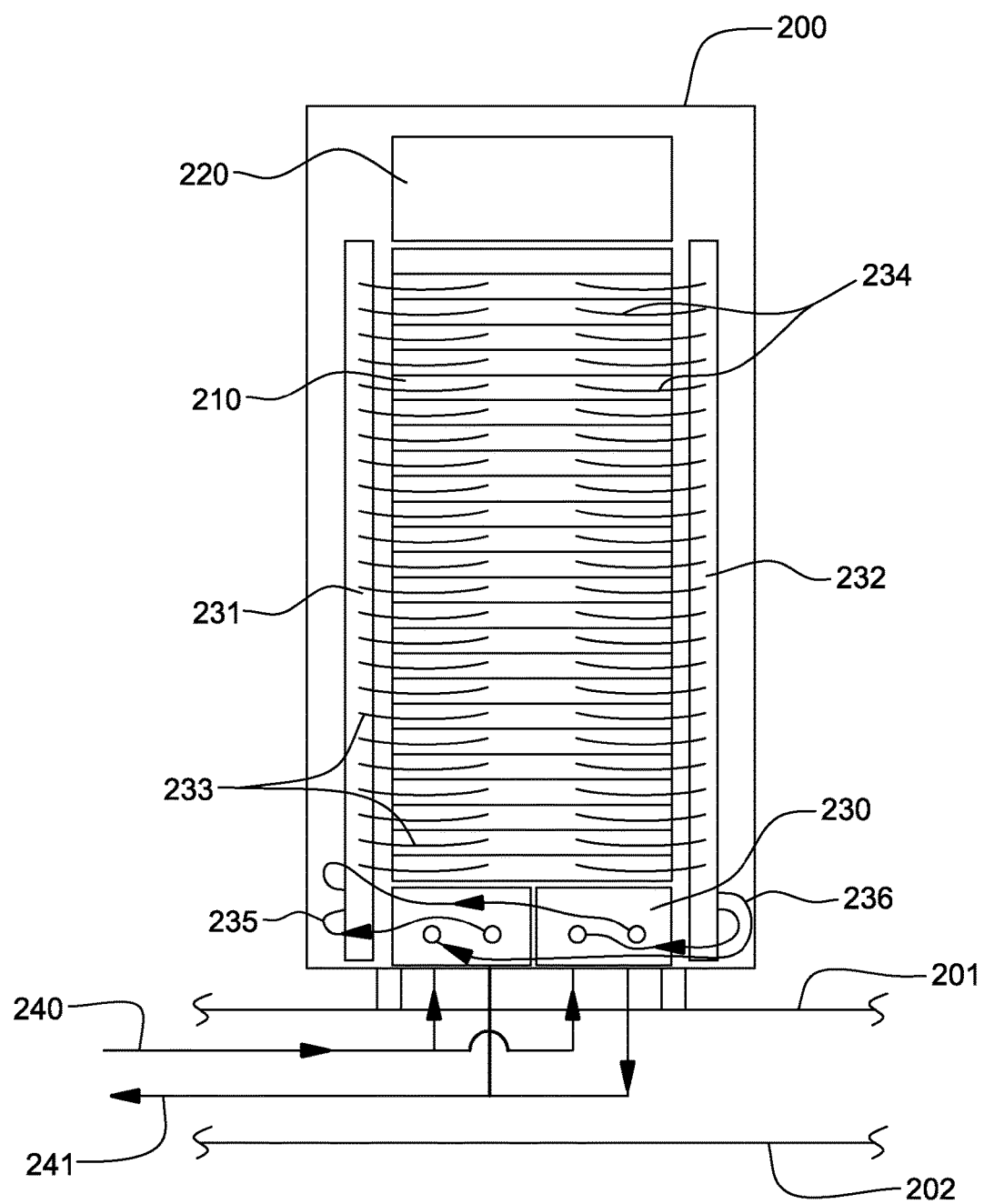
FIG. 2 is a front elevational view of one embodiment of an at least partially coolant-cooled electronics rack comprising multiple electronic subsystems and a cooling apparatus to use one or more tapering couplers, in accordance with one or more aspects of the present invention.

FIG. 2 depicts one embodiment of a partially coolant-cooled electronics rack 200. As illustrated, coolant-cooled electronics rack 200 comprises a plurality of electronic subsystems 210, which may be processor or server nodes. A bulk power regulator 220 is shown disposed at an upper portion of liquid-cooled electronics rack 200, and two coolant conditioning units (CCUs) 230 are disposed in a lower portion of the liquid-cooled electronics rack. In certain embodiments described hereinbelow, the coolant is assumed to be water or an aqueous-based solution (by way of example only).

In addition to CCUs 230, the cooling system includes a system water supply manifold 231, a system water return manifold 232, and manifold-to-node fluid connect hoses 233 coupling system water supply manifold 231 to electronic subsystems 210, and node-to-manifold fluid connect hoses 234 coupling the individual electronic subsystems 210 to system water return manifold 232. Each CCU 230 is in fluid communication with system water supply manifold 231 via a respective system water supply hose 235, and each CCU 230 is in fluid communication with system water return manifold 232 via a respective system water return hose 236.

As illustrated, a portion of the heat load of the electronic subsystems is transferred from the system water to cooler facility water supplied by facility water supply line 240 and facility water return line 241 disposed, in the illustrated embodiment, in the space between a raised floor 201 and a base floor 202.

Figure 3:
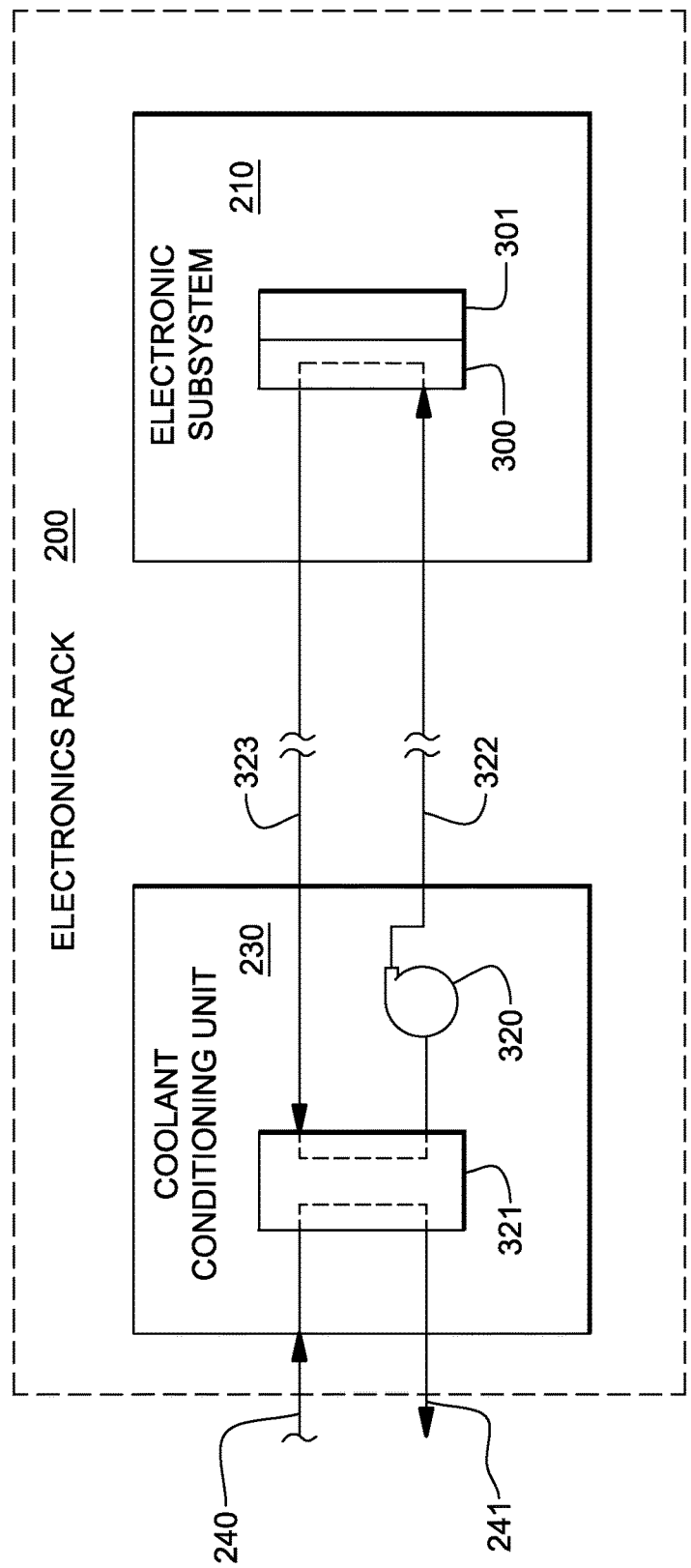
FIG. 3 is a schematic of one embodiment of an electronics rack, wherein an electronic module (or component) is coolant-cooled by system coolant (provided by one or more coolant conditioning units disposed within the electronics rack) passing through a coolant-cooled structure coupled to the electronic module, and within which one or more tapering couplers may be employed, in accordance with one or more aspects of the present invention.

FIG. 3 schematically illustrates operation of the cooling system of FIG. 2, wherein a liquid-cooled cold plate 300 is shown coupled to an electronic module 301 of an electronic subsystem 210 within the liquid-cooled electronics rack 200. Heat is removed from electronic module 301 via the system coolant circulated via pump 320 through cold plate 300 within the system coolant loop defined by liquid-to-liquid heat exchanger 321 of coolant conditioning unit 230, lines 322, 323 and cold plate 300. The system coolant loop and coolant conditioning unit are designed to provide coolant of a controlled temperature and pressure, as well as controlled chemistry and cleanliness to the electronic module(s). Furthermore, the system coolant is physically separate from the less controlled facility coolant in lines 240, 241, to which heat is ultimately transferred.

Figure 4:
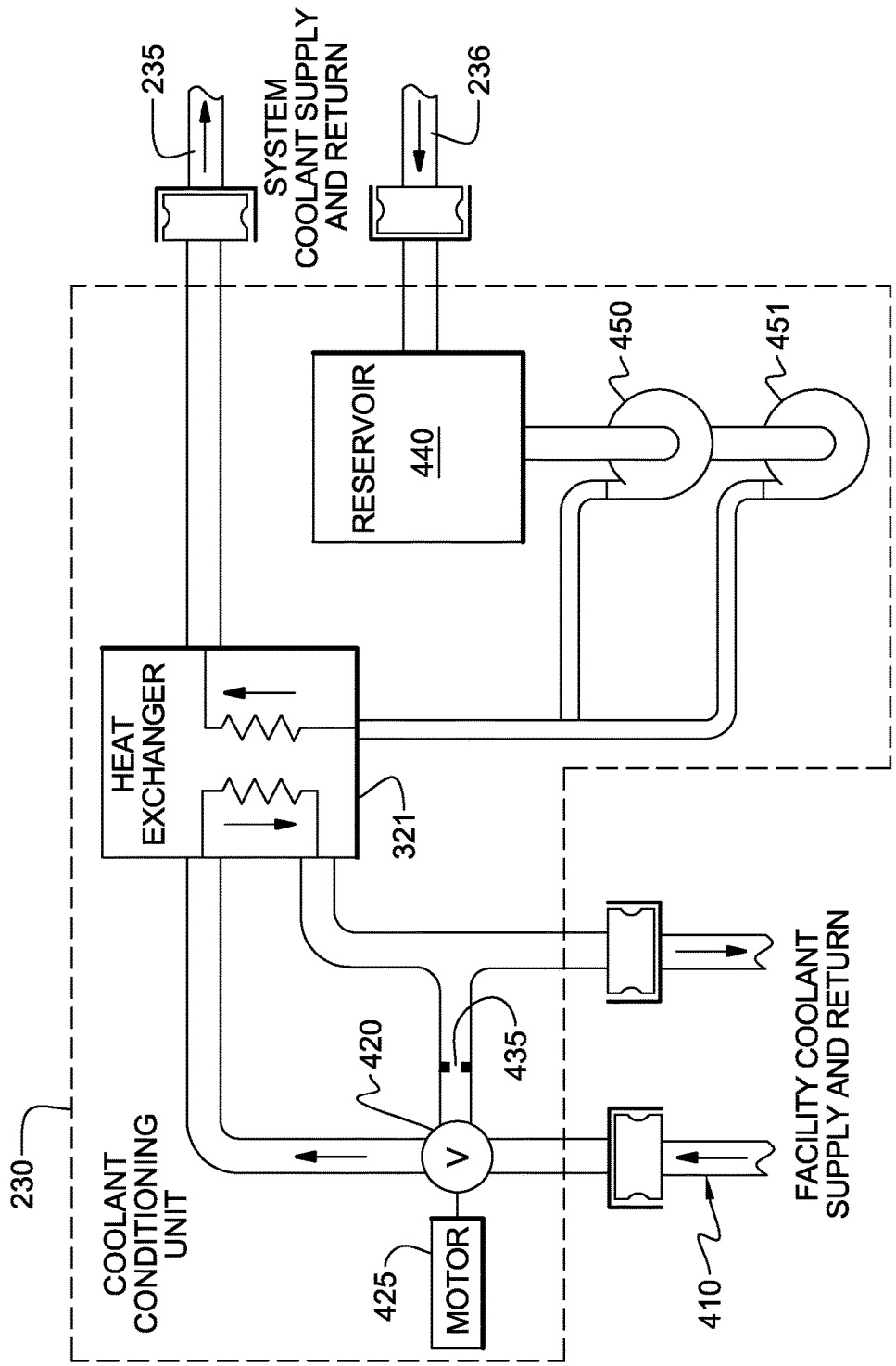
FIG. 4 is a schematic of one embodiment of a coolant conditioning unit disposed within a coolant-cooled electronics rack such as depicted in FIGS. 2 & 3, in accordance with one or more aspects of the present invention.

FIG. 4 depicts a more detailed embodiment of a coolant conditioning unit 230. As shown in FIG. 4, coolant conditioning unit 230 includes a first coolant loop wherein chilled, facility coolant is supplied 410 and passes through a control valve 420 driven by a motor 425. Valve 420 determines an amount of facility coolant to be passed through heat exchanger 321, with a portion of the facility coolant possibly being returned directly via a bypass orifice 435. The coolant conditioning unit further includes a second coolant loop with a reservoir tank 440 from which system coolant is pumped, either by pump 450 or pump 451, into the heat exchanger 321 for conditioning and output thereof, as cooled system coolant to the electronics rack to be cooled. The cooled system coolant is supplied to the system water supply manifold and returned from the system water return manifold of the liquid-cooled electronics rack via the system water supply hose 235 and system water return hose 236, respectively.

Figure 5:
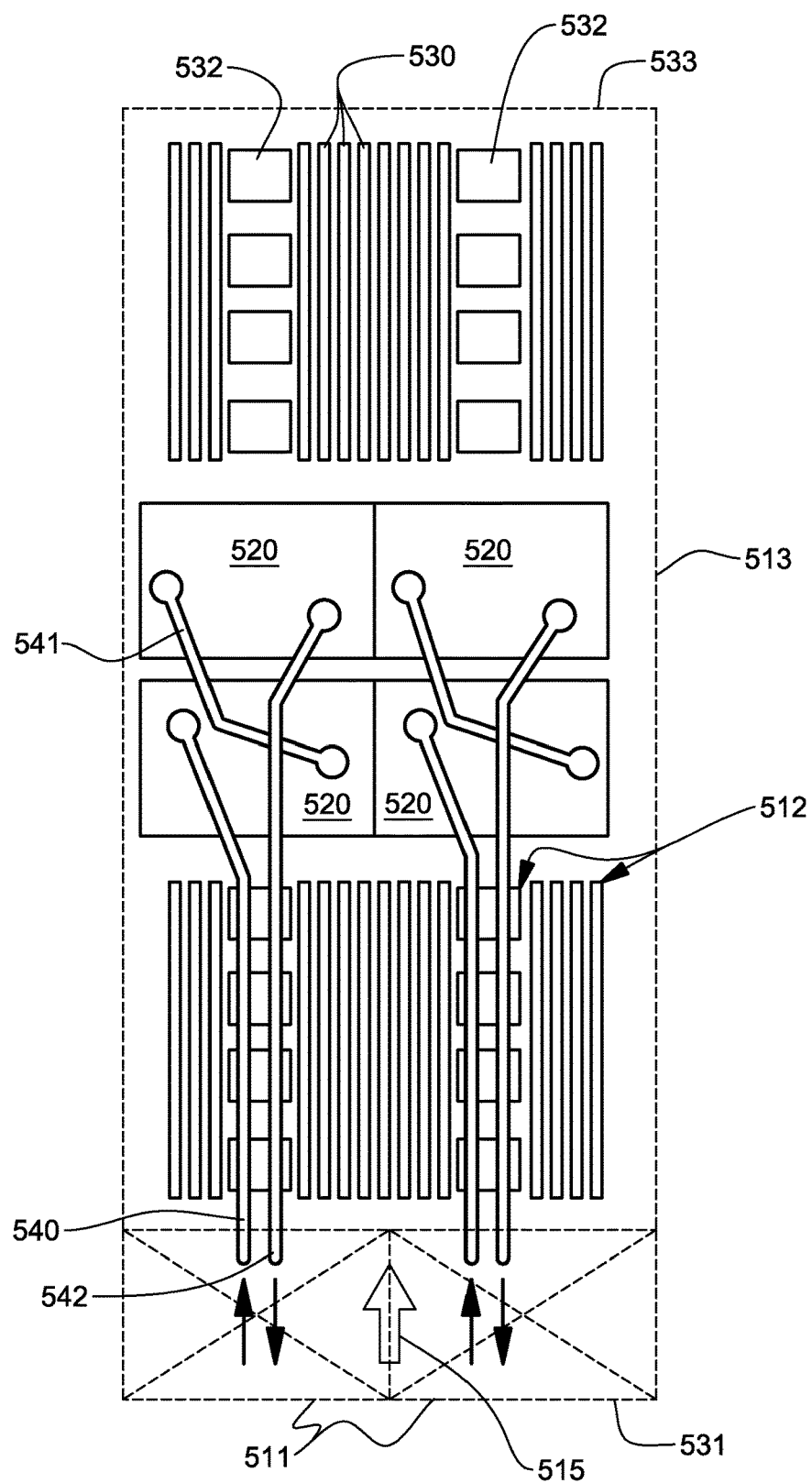
FIG. 5 is a plan view of one embodiment of an electronic subsystem layout illustrating a hybrid cooling system for cooling components of the electronic subsystem, and which may employ one or more tapering couplers, in accordance with one or more aspects of the present invention.

FIG. 5 depicts one embodiment of an electronic subsystem 513 component layout wherein one or more air moving devices 511 provide forced air flow 515 to cool multiple components 512 within electronic subsystem 513. Cool air is taken in through a front 531 and exhausted out a back 533 of the drawer. The multiple components to be cooled include multiple processor modules to which liquid-cooled cold plates 520 (of a liquid-based cooling system) are coupled, as well as multiple arrays of memory modules 530 (e.g., dual in-line memory modules (DIMMs)) and multiple rows of memory support modules 532 (e.g., DIMM control modules) to which air-cooled heat sinks are coupled. In the embodiment illustrated, memory modules 530 and the memory support modules 532 are partially arrayed near front 531 of electronic subsystem 513, and partially arrayed near back 533 of electronic subsystem 513. Also, in the embodiment of FIG. 5, memory modules 530 and the memory support modules 532 are cooled by air flow 515 across the electronic subsystem.

The illustrated coolant-based cooling system further includes multiple coolant-carrying tubes connected to and in fluid communication with coolant-cooled cold plates 520. The coolant-carrying tubes comprise sets of coolant-carrying tubes, with each set including (for example) a coolant supply tube 540, a bridge tube 541 and a coolant return tube 542. In this example, each set of tubes provides coolant to a series-connected pair of cold plates 520 (coupled to a pair of processor modules). Coolant flows into a first cold plate of each pair via the coolant supply tube 540 and from the first cold plate to a second cold plate of the pair via bridge tube or line 541, which may or may not be thermally conductive. From the second cold plate of the pair, coolant is returned through the respective coolant return tube 542.

Figure 6:
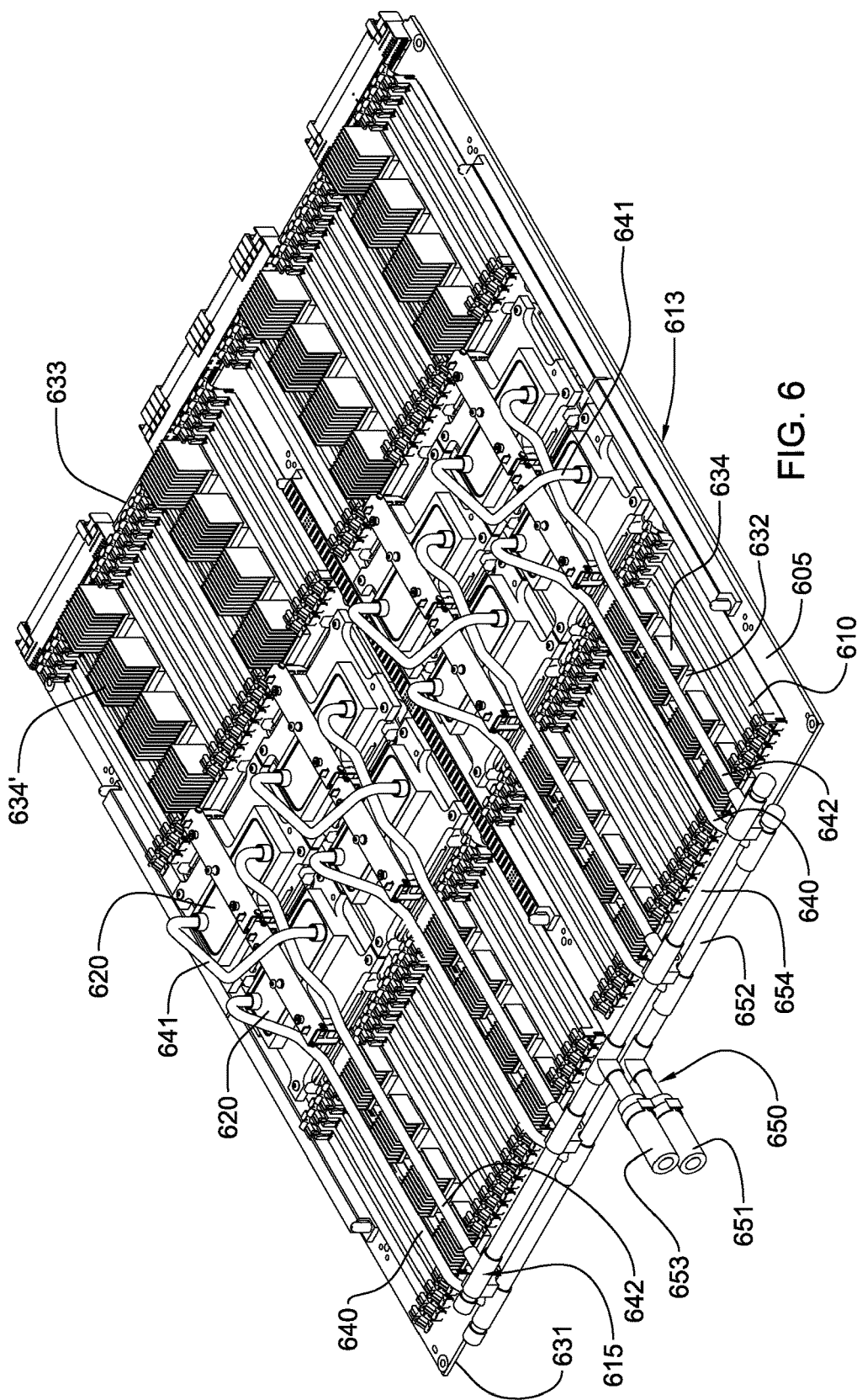
FIG. 6 depicts one detailed embodiment of a partially-assembled electronic subsystem layout, wherein the electronic subsystem includes, by way of example, eight heat-generating electronic components to be actively cooled, each having a respective coolant-cooled structure of a coolant-based cooling system coupled thereto and within which one or more tapering couplers may be employed, in accordance with one or more aspects of the present invention.

FIG. 6 depicts in greater detail an alternate electronics drawer layout comprising eight processor modules, each having a respective coolant-cooled cold plate of a coolant-based cooling system coupled thereto. The coolant-based cooling system is shown to further include associated coolant-carrying tubes for facilitating passage of liquid coolant through the coolant-cooled cold plates and a header subassembly to facilitate distribution of coolant to and return of coolant from the coolant-cooled cold plates. By way of specific example, the coolant passing through the coolant-based cooling subsystem is chilled water.

As noted, various coolants significantly outperform air in the task of removing heat from heat-generating electronic components of an electronic system, and thereby more effectively maintain the components at a desirable temperature for enhanced reliability and peak performance. As coolant-based cooling systems are designed and deployed, it is advantageous to architect systems which maximize reliability and minimize the potential for leaks while meeting all other mechanical, electrical and chemical requirements of a given electronic system implementation. These more robust cooling systems have unique problems in their assembly and implementation. For example, one assembly solution is to utilize multiple fittings within the electronic system, and use flexible plastic or rubber tubing to connect headers, cold plates, pumps and other components. In another approach, a robust coolant-assisted cooling system may be provided, specially preconfigured and prefabricated as a monolithic structure for positioning within a particular electronics drawer.

FIG. 6 is an isometric view of one embodiment of an electronics drawer and monolithic cooling system. The depicted planar server assembly includes a multi-layer printed circuit board to which memory DIMM sockets and various electronic components to be cooled are attached both physically and electrically. In the cooling system depicted, a supply header is provided to distribute coolant from a single inlet to multiple parallel coolant flow paths and a return header collects exhausted coolant from the multiple parallel coolant flow paths into a single outlet. Each parallel coolant flow path includes one or more cold plates in series flow arrangement to cool one or more electronic components to which the cold plates are mechanically and thermally coupled. The number of parallel paths and the number of series-connected coolant-cooled cold plates depends, for example on the desired device temperature, available coolant temperature and coolant flow rate, and the total heat load being dissipated from each electronic component.

More particularly, FIG. 6 depicts a partially assembled electronic system 613 and an assembled coolant-based cooling system 615 coupled to primary heat-generating components (e.g., including processor dies) to be cooled. In this embodiment, the electronics system is configured for (or as) an electronics drawer of an electronics rack, and includes, by way of example, a support substrate or planar board 605, a plurality of memory module sockets 610 (with the memory modules (e.g., dual in-line memory modules) not shown), multiple rows of memory support modules 632 (each having coupled thereto an air-cooled heat sink 634), and multiple processor modules (not shown) disposed below the coolant-cooled cold plates 620 of the coolant-based cooling system 615.

In addition to coolant-cooled cold plates 620, coolant-based cooling system 615 includes multiple coolant-carrying tubes, including coolant supply tubes 640 and coolant return tubes 642 in fluid communication with respective coolant-cooled cold plates 620. The coolant-carrying tubes 640, 642 are also connected to a header (or manifold) subassembly 650 which facilitates distribution of coolant to the coolant supply tubes and return of coolant from the coolant return tubes 642. In this embodiment, the air-cooled heat sinks 634 coupled to memory support modules 632 closer to front 631 of electronics drawer 613 are shorter in height than the air-cooled heat sinks 634' coupled to memory support modules 632 near back 633 of electronics drawer 613. This size difference is to accommodate the coolant-carrying tubes 640, 642 since, in this embodiment, the header subassembly 650 is at the front 631 of the electronics drawer and the multiple liquid-cooled cold plates 620 are in the middle of the drawer.

Coolant-based cooling system 615 comprises a pre-configured monolithic structure which includes multiple (pre-assembled) coolant-cooled cold plates 620 configured and disposed in spaced relation to engage respective heat-generating electronic components. Each coolant-cooled cold plate 620 includes, in this embodiment, a coolant inlet and a coolant outlet, as well as an attachment subassembly (i.e., a cold plate/load arm assembly). Each attachment subassembly is employed to couple its respective coolant-cooled cold plate 620 to the associated electronic component to form the cold plate and electronic component assemblies. Alignment openings (i.e., thru-holes) are provided on the sides of the cold plate to receive alignment pins or positioning dowels during the assembly process. Additionally, connectors (or guide pins) are included within attachment the subassembly, which facilitate use of the attachment assembly.

As shown in FIG. 6, header subassembly 650 includes two manifolds, i.e., a coolant supply header 652 and a coolant return header 654, which in one embodiment, are coupled together via supporting brackets. In the monolithic cooling structure of FIG. 6, the coolant supply header 652 is metallurgically bonded in fluid communication to each coolant supply tube 640, while the coolant return header 654 is metallurgically bonded in fluid communication to each coolant return tube 642. A single coolant inlet 651 and a single coolant outlet 653 extend from the header subassembly for coupling to the electronics rack's coolant supply and return manifolds (not shown).

FIG. 6 also depicts one embodiment of the pre-configured, coolant-carrying tubes. In addition to coolant supply tubes 640 and coolant return tubes 642, bridge tubes or lines 641 are provided for coupling, for example, a coolant outlet of one coolant-cooled cold plate to the coolant inlet of another coolant-cooled cold plate to connect in series fluid flow the cold plates, with the pair of cold plates receiving and returning coolant via a respective set of coolant supply and return tubes. In one embodiment, the coolant supply tubes 640, bridge tubes 641 and coolant return tubes 642 are each pre-configured, semi-rigid tubes formed of a thermally conductive material, such as copper or aluminum, and the tubes are respectively brazed, soldered or welded in a fluid-tight manner to the header subassembly and/or the liquid-cooled cold plates. The tubes are pre-configured for a particular electronics system to facilitate installation of the monolithic structure in engaging relation with the electronics system.

The above-described cooling approach of FIGS. 2-6 is an effective solution for circulating liquid coolant through coolant-cooled cold plates attached to heat-generating circuit modules (or components). An example of the efficacy of this approach is the IBM Power 575™ system offered by International Business Machines Corporation, Armonk, N.Y. In the embodiment of FIGS. 2-6, one or more coolant conditioning units containing a pump and, for example, a water-to-water heat exchanger, may be disposed within each electronics rack. As explained above, heat load carried by the system coolant circulating through the coolant-cooled components in the coolant-cooled electronics rack is rejected to facility chilled water passing through the second coolant path through the active water-to-water heat exchangers within the coolant conditioning units disposed within the rack units.

The efficient extraction of heat from electronic modules, nodes and/or racks, becomes more important as heat generated within the modules, nodes or racks increases. Lacking an efficient heat transfer mechanism, the speed, reliability and power capabilities of the electronic circuit modules, nodes and rack, will be limited. As the density of circuitry within a given space is increased, the need for improved heat extraction becomes more important. As explained above in connection with FIGS. 2-6, liquid-cooling assemblies may be employed as effective cooling solutions for removing heat generated by electronic modules, nodes or racks. Liquid-cooling of higher-power-dissipating components is particularly advantageous. However, significant constraints exist on available space for fluid-cooling equipment. For instance, there is little or no room to increase pump size or heat exchanger size within a current electronic subsystem or rack.

Disclosed herein are apparatuses and methods, for space-constrained systems, to reduce overall cooling system flow impedance for improved system flow, and thus, improved thermal performance, resulting in a more efficient heat transfer for cooling an electronic structure, such as an electronic module, node or rack. As one specific example, pressure drop where a coolant flow conduit connects to a coolant manifold may be about 20% of the total pressure drop through a coolant-carrying assembly, such as the coolant pressure drop through a cooled electronic subsystem or node described above.

More particularly, the apparatuses and methods of fabrication disclosed herein include tapering couplers that facilitate reducing or minimizing loss of energy in a fluid when transitioning from one channel flow diameter to another channel flow diameter, where the channel flow diameters are differently sized. For instance, pressure drop may occur where a fluid flow transitions from a first fluid flow component with a small cross-sectional flow area to a second fluid flow component with a larger cross-sectional flow area. The same issue arises when fluid flow transitions from a larger cross-sectional flow area to a smaller cross-sectional flow area. Note that as used herein, "fluid flow component" or "flow component" refers generally to any conduit, fitting, manifold, housing, structure, etc., having a fluid-carrying channel, with the conduit-to-fitting couplers described below with reference to FIGS. 7A-10C being one example only of the use of the tapering couplers described herein.

Figure 7A:
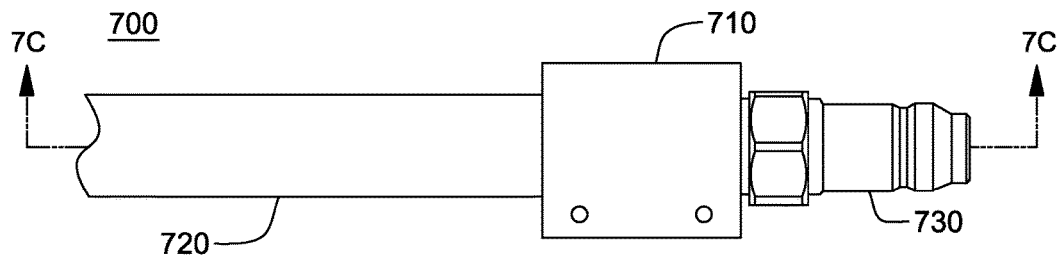
FIG. 7A depicts one embodiment of an apparatus comprising a fluid conduit, fitting and tapering coupler, to be modified in accordance with one or more aspects of the present invention.
Figure 7B:
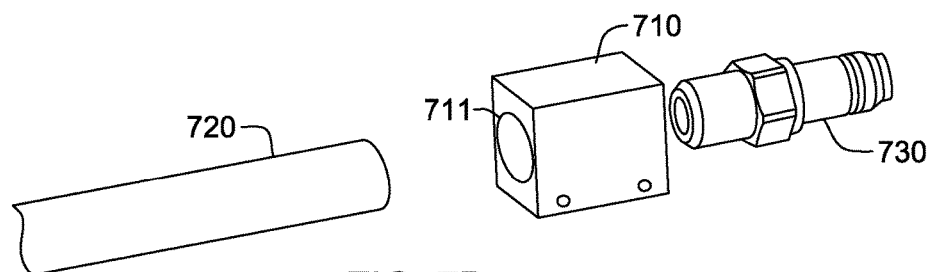
FIG. 7B is an exploded depiction of the apparatus of FIG. 7A.
Figure 7C:
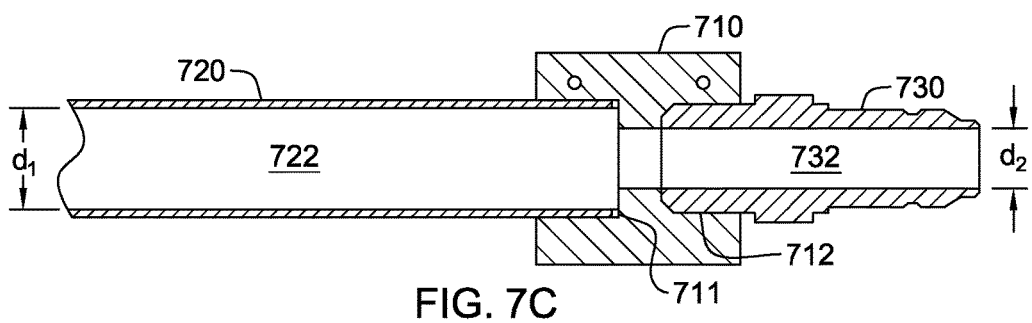
FIG. 7C is a cross-sectional elevational view of the apparatus of FIG. 7A, taken along line 7C-7C thereof.

FIGS. 7A-7C depict one embodiment of a connector apparatus, such as for a cooling assembly described above in connection with FIGS. 2-6. Connector apparatus 700 includes a coupler 710, a first fluid flow component 720, comprising a fluid conduit with a first fluid-carrying channel 722 having a first internal flow diameter $d_1$, and a second fluid flow component 730, such as a quick connect fitting, with a second fluid-carrying channel 732 having a second internal flow diameter $d_2$. In this example, first internal flow diameter $d_1$ is larger than second internal flow diameter $d_2$, as illustrated in FIG. 7C. In the illustrated example, coupler 710 includes a first opening 711 at a first side of the coupling, and a second opening 712 at a second side of the coupling. The openings 711, 712 are sized and configured, in this example, to respectively receive an end portion of the first fluid flow component 720 and second fluid flow component 730, as shown.

By way of specific example, the first fluid flow component 720 may be a metal conduit or tube, and coupler 710 may include a metal housing, with the metal conduit being secured to the coupler by welding after inserting the end of the metal conduit within opening 711 of coupler 710. Fluid flow component 730 may, in one example, be threadably secured to coupler 710 by providing appropriately sized and configured threads within opening 712 of coupler 710, and on the end of component 730 engaging the coupler.

In the embodiments of FIGS. 7A-7C, the coupler provides a fluid-tight connection between the different fluid flow components 720, 730, but no tapered transitioning between their different internal flow diameters $d_1$, $d_2$. As a solution, a gradual transition fitting could be provided at the first side or the second side of the coupler, which would transition from, for instance, the larger fluid flow diameter $d_1$ to the smaller fluid flow diameter $d_2$. The difficulty with this approach is that the additional transitional fitting requires further space in the system within which the coupling is being used, which can be a problem when implemented in a coolant-cooled assembly for an electronic module, node or rack, such as described above. An alternative approach would be to employ a tube expander region, produced using a tube expander tool, starting with a smaller-diameter tube, and forcing the cross-section of the tube to increase step-wise. The difficulty with this approach again is that additional space is required for the expander region in order to accomplish the transition between the different fluid flow diameters. Further, there are limits to the amount an expander tool can step-wise change a flow diameter, such that a significant length of tube may be required in order to effect a desired transition.

Figure 8A:
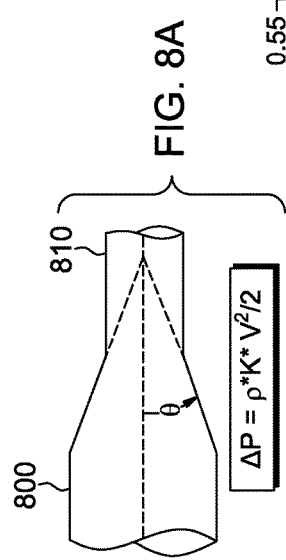
FIG. 8A is a schematic of a fluid conduit transitioning from a first fluid flow diameter to a second fluid flow diameter.

FIG. 8A illustrates a gradual transition between a first fluid flow region 800 and a second fluid flow region 810 having different internal fluid flow diameters, where the transition angle is labeled θ.

Figure 8B:
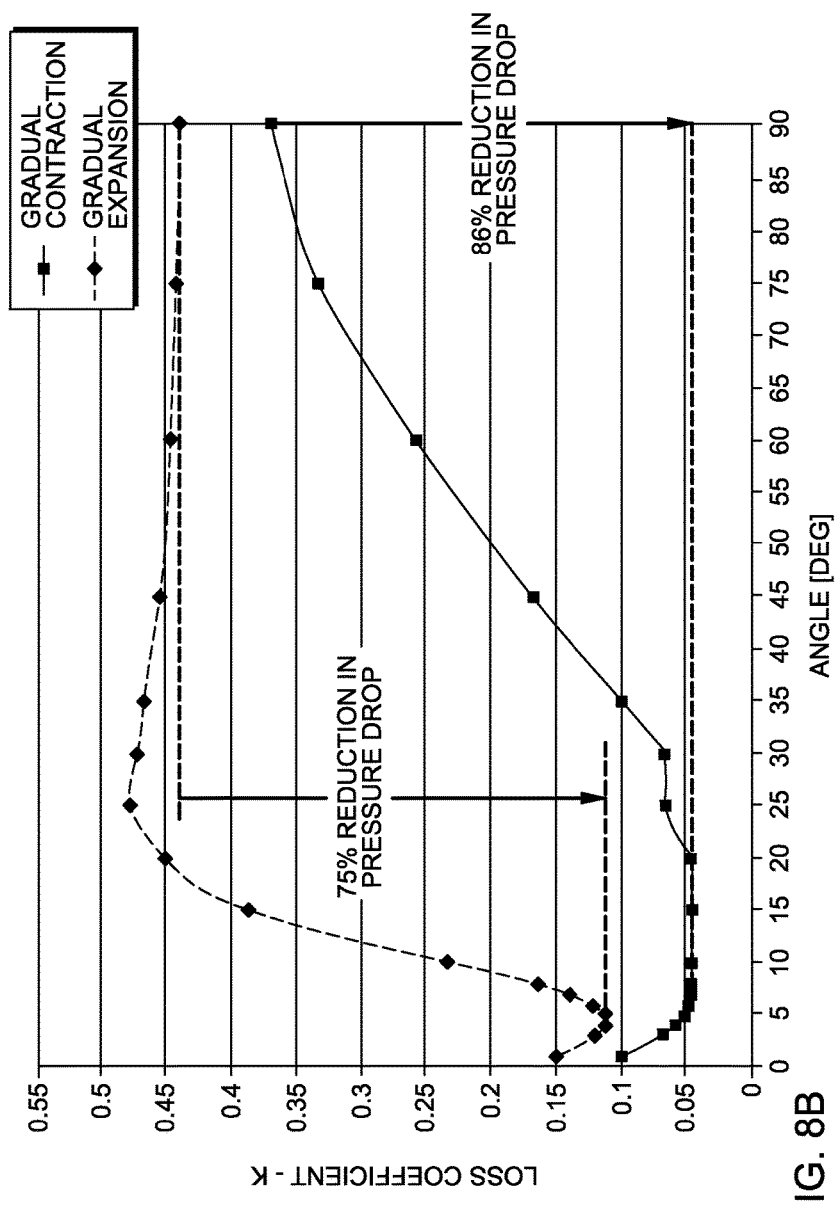
FIG. 8B is a graph of loss coefficient versus angle of taper when transitioning between differently-sized fluid flow diameters, with both contracting and expanding loss coefficients plotted.

FIG. 8B plots the loss coefficient due to pressure drop at a coupling or region, such as illustrated in FIG. 8A, transitioning between different fluid flow diameters versus the angle of transition (θ) in degrees. Both a gradual contraction case and a gradual expansion case are plotted. In particular, in addition to the frictional pressure loss associated with conduit fluid flow, there are losses due to the sudden or gradual expansion or contraction of flow from one characteristic flow diameter to another. This loss can be characterized in terms of a loss coefficient, K, and is related to pressure loss (drop) by:

$$K = \frac{\Delta P}{(\rho V^2/2)}$$

Where $\Delta P$ is the pressure loss (drop), $\rho$ is the fluid density, and V is the mean fluid velocity entering the transition.

If the expansion or contraction is gradual, as in a gradual conical expansion or contraction (i.e., a diffuser), the pressure loss can be significantly reduced. Relative to a sudden expansion or contraction ($\theta=90°$), a diffuser with a gradual expansion or contraction defined by an angle $\theta=5°$, the pressure loss can be reduced by 75% in the expansion case, and by 86% in the contraction case, as shown in FIG. 8B. As illustrated, a taper angle in the range of 1–10°, and more particularly, in the range of 3–7°, most advantageously reduces pressure drop through a coupler connecting fluid flow components with different characteristic flow diameters. About a 5° taper angle produces optimum reduction or minimization in the pressure drop through the coupling. In certain implementations, the apparatuses and methods, and in particular, tapering couplers, described herein include tapering insert elements which embody such an optimized taper angle.

Generally stated, disclosed herein are apparatuses and methods which include or provide a tapering coupler that comprises a housing and a tapering element associated with the housing. The housing includes a first opening and a second opening in fluid communication through the housing, with the first opening being sized for a first fluid flow component to couple to the housing, and the second opening being sized for a second fluid flow component to couple to the housing. The first fluid flow component and second fluid flow component include a first fluid-carrying channel and a second fluid-carrying channel, respectively, with the first fluid-carrying channel having a first channel diameter and the second fluid-carrying channel having a second channel diameter. The first channel diameter is larger than the second channel diameter. Note that as used herein, the "channel diameter", "internal flow diameter", "flow diameter", or "cross-sectional flow area" are used interchangeably, and refer to the characteristic diameter of a fluid flow channel through a fluid flow component. The tapering element associated with the housing is configured to extend into the first fluid-carrying channel of the first fluid flow component when the first fluid flow component is coupled to the housing, with the first fluid-carrying channel of the first fluid flow component and the first opening of the housing in fluid communication. The tapering element includes a tapering fluid-carrying channel which tapers in a direction towards the housing from about the first channel diameter to about the second channel diameter. In one implementation, the tapering element extends outwards from the housing, and the tapering fluid-carrying channel of the tapering element tapers uniformly from about the first channel diameter to the second channel diameter at a taper angle $\theta$. In certain implementations, taper angle $\theta$ is within a 1-10° taper range, and more particularly, in a range of 3–7°. For instance, taper angle $\theta$ may be about a 5° taper angle.

Note that approximating language, as used herein throughout the specification and claims, is applied to modify any quantitative representation that could permissibly vary without resulting in change in the basic function to which it is related. A value modified by a term such as "about", is not limited to a precise value specified. For instance, tapering of the tapering fluid-carrying channel progresses from slightly smaller than the first channel diameter is due to the thickness of the material at the end of the tapering element farthest from the housing. For instance, the tapering may proceed from the first channel diameter, less a few millimeters' thickness of the tapering element, down to the second channel diameter.

In certain implementations, the tapering element is formed integral with the housing to be a part of the housing, and the first opening in the housing is disposed in the tapering element. In one embodiment, the housing further includes a recess surrounding the tapering insert element. The recess is configured to receive an end of the first fluid flow component, to facilitate coupling of the first fluid flow component to the housing, with the tapering element extending into the first fluid-carrying channel of the first fluid flow component. By way of example, the tapering element may extend from a first side of the housing, and the second opening may be disposed in a second side of the housing, where the first and second sides of the housing are opposite sides of the housing.

In other implementations, the tapering element may be a tapering insert element distinct from the housing, but secured to the housing. For instance, the tapering insert element may be separately fabricated (for instance, of a plastic or metal) and inserted into the housing so as to be secured within the housing. By way of example, the tapering insert element may be inserted into the housing through the second opening so as to project out through the first opening in the housing. By way of example, a shoulder may be provided within the housing, sized and configured to be engaged by a circumferential ring or shoulder about the tapering insert element with insertion of the tapering insert element into the housing, through the second opening. In such a case, the tapering insert element may be secured within the housing by threadably inserting an end of the second fluid flow component into the second opening of the housing, thereby securing the tapering insert element within the housing.

In certain embodiments, the tapering element is configured such that the tapering fluid-carrying channel of the tapering element resides within, at least in part, the first fluid flow component when the first fluid flow component and the housing are coupled with the first fluid-carrying channel of the first fluid flow component and the first opening of the housing in fluid communication. For instance, at least a portion of the tapering fluid-carrying channel may reside within the first fluid flow component. In certain implementations, a portion of the tapering fluid-carrying channel may reside within the housing, depending upon the length required in order to achieve the gradual transition or taper desired. Fluid-carrying assemblies and methods of fabrication are also described below.

Figure 9A:
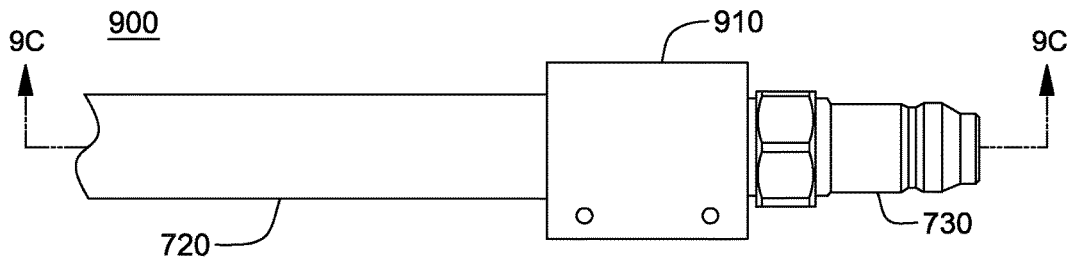
FIG. 9A depicts one embodiment of an apparatus comprising a fluid conduit, a fitting, and a tapering coupler, in accordance with one or more aspects of the present invention.
Figure 9B:
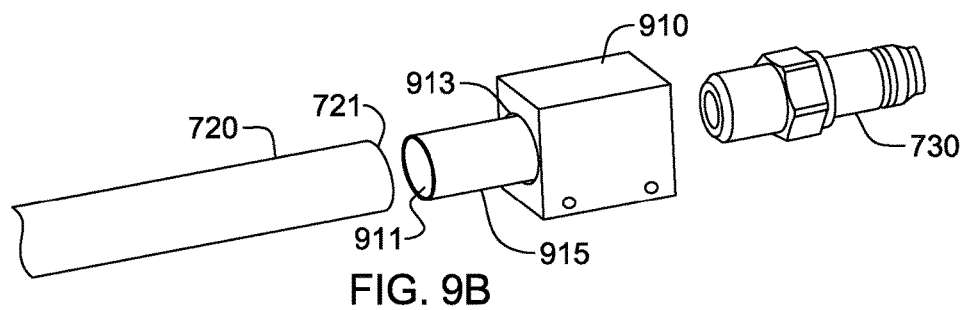
FIG. 9B is an exploded depiction of the apparatus of FIG. 9A, in accordance with one or more aspects of the present invention.
Figure 9C:
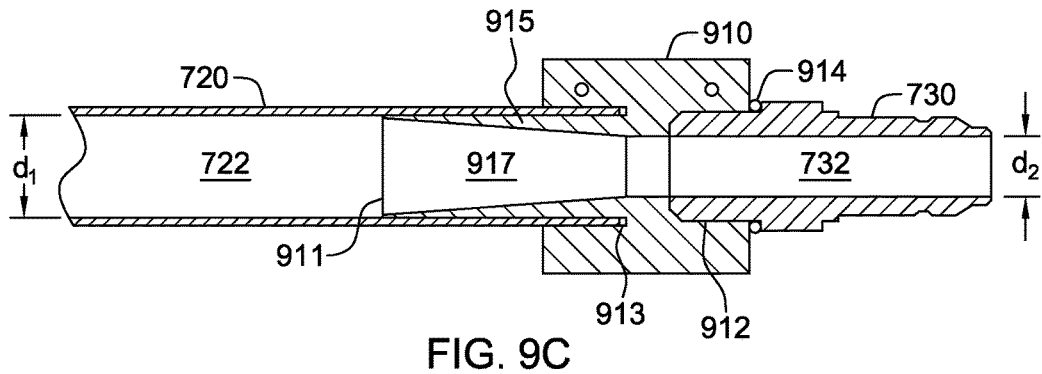
FIG. 9C is a cross-sectional elevational view of the apparatus of FIG. 9A, taken along line 9C-9C thereof, in accordance with one or more aspects of the present invention.

FIGS. 9A-9C depict one embodiment of a connector apparatus, in accordance with one or more aspects of the present invention.

In one implementation, the connector apparatus may be employed for a cooling assembly, such as described above in connection with FIGS. 2-6. Connector apparatus 900 includes a tapering coupler 910, as well as first fluid component 720 and second fluid flow component 730, described above in connection with FIGS. 7A-7C. By way of example only, first fluid flow component 720 is illustrated to comprise a fluid conduit with a first fluid-carrying channel 722 having a first internal flow diameter $d_1$, and second fluid flow component 730 is illustrated as a quick connect fitting, with a second fluid-carrying channel 732 having a second internal flow diameter $d_2$. In the example depicted, first internal flow diameter $d_1$ is larger than second internal flow diameter $d_2$, as illustrated in FIG. 9C.

As shown in FIGS. 9B & 9C, housing 910 includes a first opening 911 and a second opening 912 (FIG. 9C) sized and configured for first fluid flow component 720 and second fluid flow component 730, respectively. In the embodiment of FIGS. 9A-9C, first opening 911 resides within a tapering element 915, which as indicated in FIG. 9C, is formed integral with housing 910, to be part of housing 910, and to project from one side thereof. By way of example only, first opening 911 and second opening 912 are provided on opposite sides of housing 910, and are in fluid communication through the housing, as illustrated in FIG. 9C.

In one embodiment, a circumferential recess 913 may be provided in housing 910 about a tapering element 915 to accommodate an end of first fluid flow component 720, for instance, to facilitate coupling and securing of the fluid flow component to housing 910, for instance, by welding or brazing. In one implementation, second opening 912 may include threads (not shown) sized and configured to facilitate threaded insertion of second fluid flow component 730 therein. One or more O-rings or gaskets 914 may be provided in association with second fluid flow component 730, and/or first fluid flow component 720 and/or housing 910, to facilitate fluid-tight coupling of the components and housing. Use of O-rings or gaskets may depend, in part, on the type of component the first and second fluid flow components 720, 730 represent, and how they are secured to housing 910. As noted, and by way of example only, first fluid flow component 720 is depicted as a fluid conduit, and second fluid flow component 730 is depicted as a fitting, such as a quick connect fitting, to facilitate coupling of the fluid conduit to, for instance, a part of a liquid manifold of a fluid-carrying assembly, such as illustrated in FIGS. 2-6.

As illustrated in FIG. 9C, tapering element 915 includes a tapering fluid-carrying channel 917 which tapers in a direction back towards housing 910 from about the first channel diameter $d_1$, to about the second channel diameter $d_2$. In certain implementations, the tapering fluid-carrying channel 917 of the tapering element 915 uniformly tapers from about the first channel diameter $d_1$ to about the second channel diameter at a taper angle $\theta$, which is in a range of 1–10°, such as in a range of about 3-7°, or more particularly, is approximately a 5° taper angle. By extending into the first fluid-carrying channel 722 of first fluid flow component 720, at least a portion of the tapering of the tapering fluid-carrying channel 917 occurs within the first fluid flow component 720, as illustrated. Further, by providing a circumferential recess or channel 913 in housing 910, most, if not all, of the tapering element 915 may reside within first fluid flow component 720, as illustrated in FIG. 9C. Note that in this embodiment, tapering element 915 is formed integral with housing 910, for instance, may be casted or machined as a monolithic structure from a metal or metal alloy. Depending on the size of housing 910, and the difference between the channel diameters to transition between, a majority of the tapering fluid-carrying channel 917 of tapering element 915 may project out from housing 910.

Figure 10A:
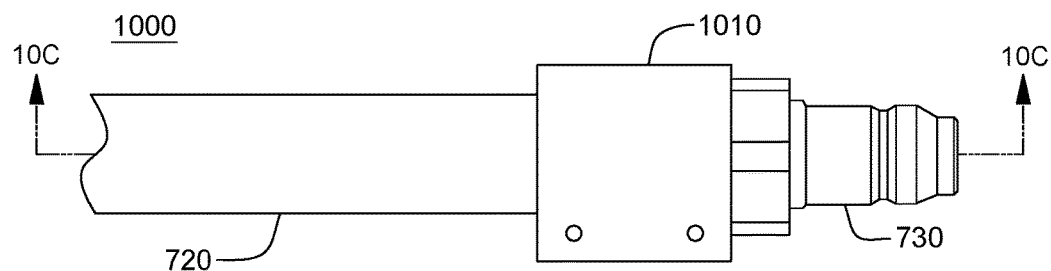
FIG. 10A depicts another embodiment of an apparatus comprising a fluid conduit, a fitting, and a tapering coupler, in accordance with one or more aspects of the present invention.
Figure 10B:
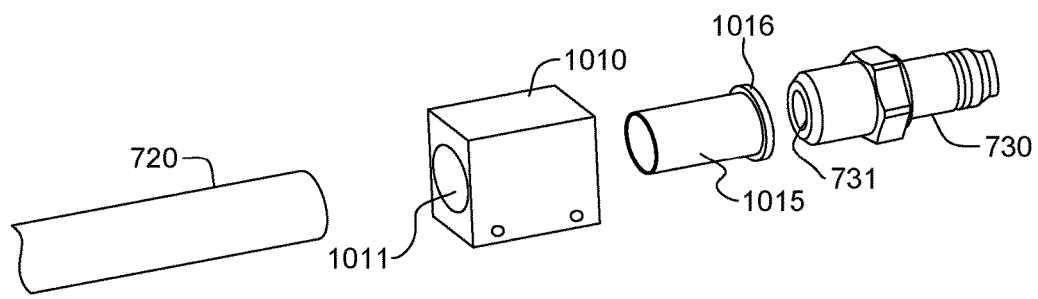
FIG. 10B is an exploded depiction of the apparatus of FIG. 10A, in accordance with one or more aspects of the present invention.
Figure 10C:
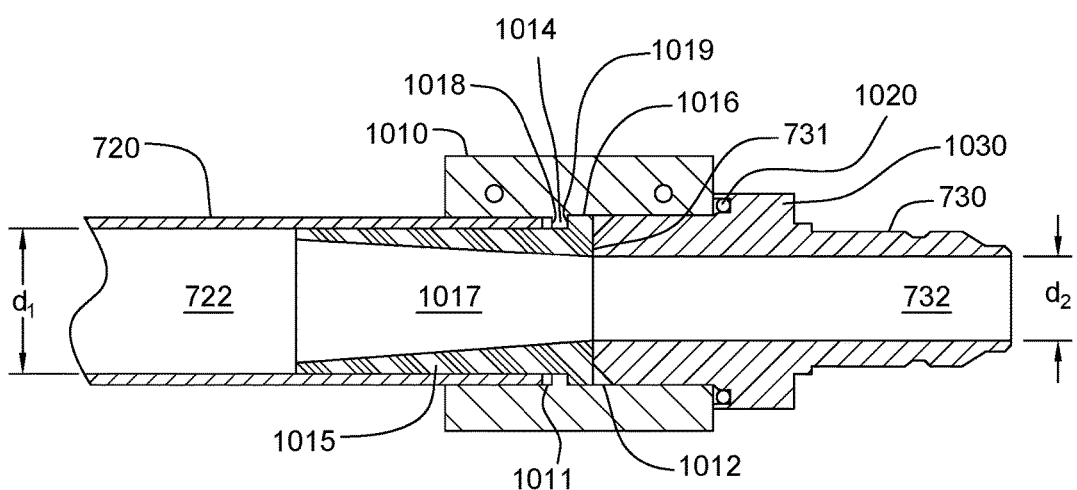
FIG. 10C is a cross-sectional elevational view of the apparatus of FIG. 10A, taken along line 10C-10C thereof, in accordance with one or more aspects of the present invention.

FIGS. 10A-10C depict an alternate embodiment of a connector apparatus, generally 1000, in accordance with one or more aspects of the present invention.

Connector apparatus 1000 includes first fluid flow component 720 and second fluid flow component 730, which, as noted above in connection with FIGS. 7A-7C & 9A-9C, are illustrated by way of example as a fluid conduit, and a connector fitting, respectively. As noted, however, the first and second fluid flow components could comprise any fluid flow components to be coupled or joined using a tapering coupler 1010, such as described herein.

As illustrated in FIG. 10B, in this embodiment, the tapering coupler includes housing 1010, and a separate tapering insert element 1015, which is configured to be secured within housing 1010 so as to project from a first opening 1011 in housing 1010 at a first side of the housing. As illustrated in FIGS. 10B & 10C, tapering insert element 1015 may be provided with a circumferential ring or shoulder 1016, sized to allow tapering insert element 1015 to pass into housing 1010 through a second opening 1012 therein at the second side of housing 1010. Circumferential ring or shoulder 1016 is sized and positioned to engage an edge or stop 1014, formed within housing 1010, in the interconnecting opening of housing 1010, between first opening 1011 and second opening 1012 thereof. As shown, edge stop 1014 includes a first side 1018 closer to the first opening 1011 and a second side 1019 closer to the second opening 1012. An end 731 of second flow component 730 is configured (in one embodiment) to threadably insert into second opening 1012 of housing 1010 and engage tapering insert element 1015 in order to secure the tapering insert element 1015 within housing 1010. As depicted, a seal 1020 is disposed between an outer flange 1030 of second flow component 730 and housing 1010 to facilitate sealing second flow component 730 to housing 1010.

As in the embodiment of FIGS. 9A-9C, tapering insert element 1015 projects into first fluid-carrying channel 722 of first fluid flow component 720 when first fluid flow component 720 is operatively coupled to housing 1010. To facilitate this coupling, first opening 1011 in housing 1010 may be sized and configured to accommodate first fluid flow component 720 therein, as illustrated in FIG. 10C. By way of example, first fluid flow component 720 may be secured to housing 1010 via, for instance, solder, in the case where first fluid flow component 720 and housing 1010 are formed of a metal or metal alloy.

As illustrated, tapering insert element 1015 includes a tapering fluid-carrying channel 1017, which tapers in a direction back towards the housing, from about the first channel diameter $d_1$ of first fluid-carrying channel 722 to about the second channel diameter $d_2$ of second fluid-carrying channel 732. As noted above, the taper angle may be uniform through the tapering insert element, and be, for instance, in a range of 1–10°, or more particularly, in a range of 3–7°. Depending on the implementation, and the difference between the first and second channel diameters, a majority of the tapering insert element 1015 may reside within the first fluid flow component 720, having the larger channel diameter, when the connector apparatus is operatively employed as depicted in FIGS. 10A-10C.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. An apparatus comprising:
   a first fluid flow component and a second fluid flow component;
   a tapering coupler, the tapering coupler comprising:
      a housing with a first opening and a second opening in fluid communication through the housing, the first fluid flow component being connected into the housing at the first opening, and the second fluid flow component being connected into the housing at the second opening, the first fluid flow component and the second fluid flow component comprising a first fluid-carrying channel and a second fluid-carrying channel, respectively, the first fluid-carrying channel having a first constant internal channel diameter and the second fluid-carrying channel having a second constant internal channel diameter, wherein the first constant internal channel diameter is larger than the second constant internal channel diameter, and wherein the housing includes an edge stop projecting radially inward, the edge stop being positioned between the first opening and the second opening in the housing with a first side closer to the first opening and a second side closer to the second opening; and
      a tapering element disposed within the housing and extending into and residing within the first fluid-carrying channel of the first fluid flow component with the first fluid flow component connected into the housing, with the first fluid-carrying channel of the first fluid flow component and the first opening of the housing in fluid communication, the tapering element including a circumferential shoulder sized and positioned to reside against the second side of the edge stop within the housing, with the tapering element operatively disposed within the housing, and the tapering element comprising a tapering fluid-carrying channel which tapers down from the first constant internal channel diameter within the first fluid flow component towards the housing, and extends axially outward from the housing, the tapering element tapering from about the first constant internal channel diameter to about the second constant internal channel diameter, wherein with the first fluid flow component connected into the housing, the first fluid flow component resides, in part, within the housing, and is disposed in a radial direction, between the tapering element and a periphery of the housing, and wherein an end of the second fluid flow component within the housing contacts an end of the tapering element within the housing to maintain the circumferential shoulder of the tapering element against the second side of the edge stop within the housing; and
      a seal disposed between an outer flange of the second flow component and the housing to facilitate sealing the second flow component to the housing.

2. The apparatus of claim 1, wherein the tapering fluid-carrying channel of the tapering element uniformly tapers from about the first constant internal channel diameter to the second constant internal channel diameter at a taper angle $\theta$.

3. The apparatus of claim 2, wherein the taper angle $\theta$ is in a range of a 1-10 degrees.

4. The apparatus of claim 3, wherein the taper angle $\theta$ is about 5 degrees.

5. The apparatus of claim 1, wherein the first fluid flow component comprises a fluid conduit, and the second fluid flow component comprises a fitting configured to couple the fluid conduit to a fluid manifold.

6. A fluid-carrying assembly comprising:
   a fluid conduit;
   a fluid flow component to connect to the fluid conduit; and
   a tapering coupler, the tapering coupler comprising:
      a housing with a first opening and a second opening in fluid communication through the housing, the fluid conduit being connected into the housing at the first opening, and the fluid flow component being connected into the housing at the second opening, the fluid conduit and the fluid flow component comprising a first fluid-carrying channel and a second fluid-carrying channel, respectively, the first fluid-carrying channel having a first constant internal channel diameter, and the second fluid-carrying channel having a second constant internal channel diameter, wherein the first constant internal channel diameter is larger than the second constant internal channel diameter, and wherein the housing includes an edge stop projecting radially inward, the edge stop being positioned between the first opening and the second opening in the housing and having a first side closer to the first opening and a second side closer to the second opening; and
      a tapering element disposed within the housing and extending into and residing within the first fluid-carrying channel of the fluid conduit with the fluid conduit connected into the housing, with the first fluid-carrying channel of the fluid conduit and the first opening of the housing in fluid communication, the tapering element including a circumferential shoulder sized and positioned to reside against the second side of the edge stop within the housing, with the tapering element operatively disposed within the housing, and the tapering element comprising a tapering fluid-carrying channel which tapers down from the first constant internal channel diameter within the fluid conduit towards the housing, and extends axially outward from the housing, the tapering element tapering from about the first constant internal channel diameter to about the second constant internal channel diameter, wherein with the fluid conduit connected into the housing, the fluid conduit resides, in part, within the housing, and is disposed in a radial direction between the tapering element and a periphery of the housing and wherein an end of the fluid flow component within the housing contacts an end of the tapering element within the housing to maintain the circumferential shoulder of the tapering element against the second side of the edge stop within the housing; and a seal disposed between an outer flange of the second flow component and the housing to facilitate sealing the second flow component to the housing.

7. The fluid-carrying assembly of claim 6, wherein the tapering fluid-carrying channel of the tapering element uniformly tapers from about the first constant internal channel diameter to the second constant internal channel diameter at a taper angle θ, where taper angle θ is in a range of a 1-10°.

* * * * *